(12) United States Patent
Jung et al.

(10) Patent No.: US 11,555,779 B2
(45) Date of Patent: Jan. 17, 2023

(54) SAMPLE ANALYZER AND ANALYZING METHOD THEREOF

(71) Applicant: ELECTRONICS AND TELECOMMUNICATIONS RESEARCH INSTITUTE, Daejeon (KR)

(72) Inventors: Moon Youn Jung, Daejeon (KR); Won Bae Cho, Daejeon (KR); Dong Hoon Song, Daejeon (KR); Dong-Ho Shin, Daejeon (KR); Sang Kyun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 354 days.

(21) Appl. No.: 16/842,487

(22) Filed: Apr. 7, 2020

(65) Prior Publication Data
US 2020/0326273 A1 Oct. 15, 2020

(30) Foreign Application Priority Data
Apr. 9, 2019 (KR) .......................... 10-2019-0041649

(51) Int. Cl.
*G01N 21/17* (2006.01)
*G01N 21/55* (2014.01)
(Continued)

(52) U.S. Cl.
CPC .............. *G01N 21/17* (2013.01); *G01N 21/55* (2013.01); *G01N 21/59* (2013.01); *G01N 23/06* (2013.01);
(Continued)

(58) Field of Classification Search
CPC ........ G01N 21/17; G01N 21/55; G01N 21/59; G01N 23/06; G01N 2021/1761; G01N 2201/06113; H01J 37/26
See application file for complete search history.

(56) References Cited

U.S. PATENT DOCUMENTS

2013/0299706 A1  11/2013  Jung et al.
2016/0203944 A1*  7/2016  Ominami ............... H01J 37/20
                                                              250/310
2018/0139835 A1   5/2018  Jung et al.

FOREIGN PATENT DOCUMENTS

KR    1020150129961 A    11/2015

OTHER PUBLICATIONS

Sie, "Time-Resolved Absorption Spectroscopy," Springer International Publishing, 2018, pp. 13-25.
(Continued)

*Primary Examiner* — Nicole M Ippolito (57) ABSTRACT

The present disclosure provides a sample analyzer and an analyzing method thereof. The sample analyzer includes a first beam source configured to provide a first energy beam to a sample, a second beam source configured to provide a second energy beam, which is different from the first energy beam, to the sample, a reflected beam sensor disposed between the second beam source and the sample to detect a reflected beam of the second energy beam, which is reflected by one side of the sample, and a transmitted beam sensor disposed adjacent to the other side of the sample to detect a transmitted beam of the second energy beam.

4 Claims, 8 Drawing Sheets

(51) Int. Cl.
*G01N 21/59* (2006.01)
*G01N 23/06* (2018.01)
*H01J 37/26* (2006.01)

(52) U.S. Cl.
CPC ............... *G01N 2021/1761* (2013.01); *G01N 2201/06113* (2013.01); *H01J 37/26* (2013.01)

(56) References Cited

OTHER PUBLICATIONS

Song, "Femtosecond X-ray Laser and Ultrafast Imaging," Physics & Advanced technology, Jun. 2017.

* cited by examiner

SAMPLE ANALYZER AND ANALYZING METHOD THEREOF

CROSS-REFERENCE TO RELATED APPLICATIONS

This U.S. non-provisional patent application claims priority under 35 U.S.C. § 119 of Korean Patent Application No. 10-2019-0041649, filed on Apr. 9, 2019, the entire contents of which are hereby incorporated by reference.

BACKGROUND

The present disclosure relates to an analyzer and an analyzing method, and more particularly, to a sample analyzer using a laser beam and an analyzing method thereof.

A sample analyzer may measure a surface of a sample and the inside thereof by using a high energy beam. The high energy beam may include an ultraviolet beam, an electron beam, an ion beam, a proton beam, and a radiation beam. The general sample analyzer may include a source selectively generating any one of the ultraviolet beam, the electron beam, the ion beam, the proton beam, and the radiation beam

SUMMARY

The present disclosure provides a sample analyzer capable of real-time measuring a phase change process of a sample and an analyzing method thereof.

An embodiment of the inventive concept provides a sample analyzer including: a first beam source configured to provide a first energy beam to a sample; a second beam source configured to provide a second energy beam, which is different from the first energy beam, to the sample; a reflected beam sensor disposed between the second beam source and the sample to detect a reflected beam of the second energy beam, which is reflected by one side of the sample; and a transmitted beam sensor disposed adjacent to the other side of the sample to detect a transmitted beam of the second energy beam.

In an embodiment, the second beam source may be a multi-energy beam generator.

In an embodiment, the second beam source may include: a light source configured to generate a laser beam; and a target disposed between the light source and the sample and configured to receive the laser beam and generate the second energy beam.

In an embodiment, the second energy beam may be a multi-energy beam including an ultraviolet ray, an ion particle, a proton, an electron, and a radiation.

In an embodiment, the laser beam may be provided to the target with a time difference from the first energy beam, and the time difference may be equal to or greater than a time of flight of the radiation.

In an embodiment, the transmitted beam sensor may include a radiation sensor.

In an embodiment, the transmitted beam sensor may further include an electron sensor disposed between the sample and the radiation sensor.

In an embodiment, the transmitted beam sensor may further include a proton sensor disposed between the sample and the electron sensor.

In an embodiment, the transmitted beam sensor may further include an ion sensor disposed between the sample and the proton sensor.

In an embodiment, the reflected beam sensor may be an ultraviolet sensor.

In an embodiment of the inventive concept, a method for analyzing a sample includes: providing a first energy beam to a sample; providing a second energy beam to an exposed surface of the first energy beam of the sample; detecting a reflected beam of the second energy beam, which is reflected by the exposed surface of the first energy beam; and detecting a transmitted beam of the second energy beam, which is transmitted through the exposed surface of the first energy beam.

In an embodiment, the providing of the second energy beam may include providing the same laser beam as the first energy beam to a target prior to the first energy beam.

In an embodiment, the detecting of the transmitted beam of the second energy beam may include: detecting an ion particle beam; detecting a proton beam transmitted through the ion sensor; detecting an electron beam; and detecting a radiation beam.

In an embodiment, the detecting of the reflected beam of the second energy beam may include detecting an ultraviolet beam.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, preferred embodiments of the inventive concept will be described below in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explaining a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

Additionally, the embodiment in the detailed description will be described with sectional views as ideal exemplary views of the present invention. Also, in the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes.

Figure 1:
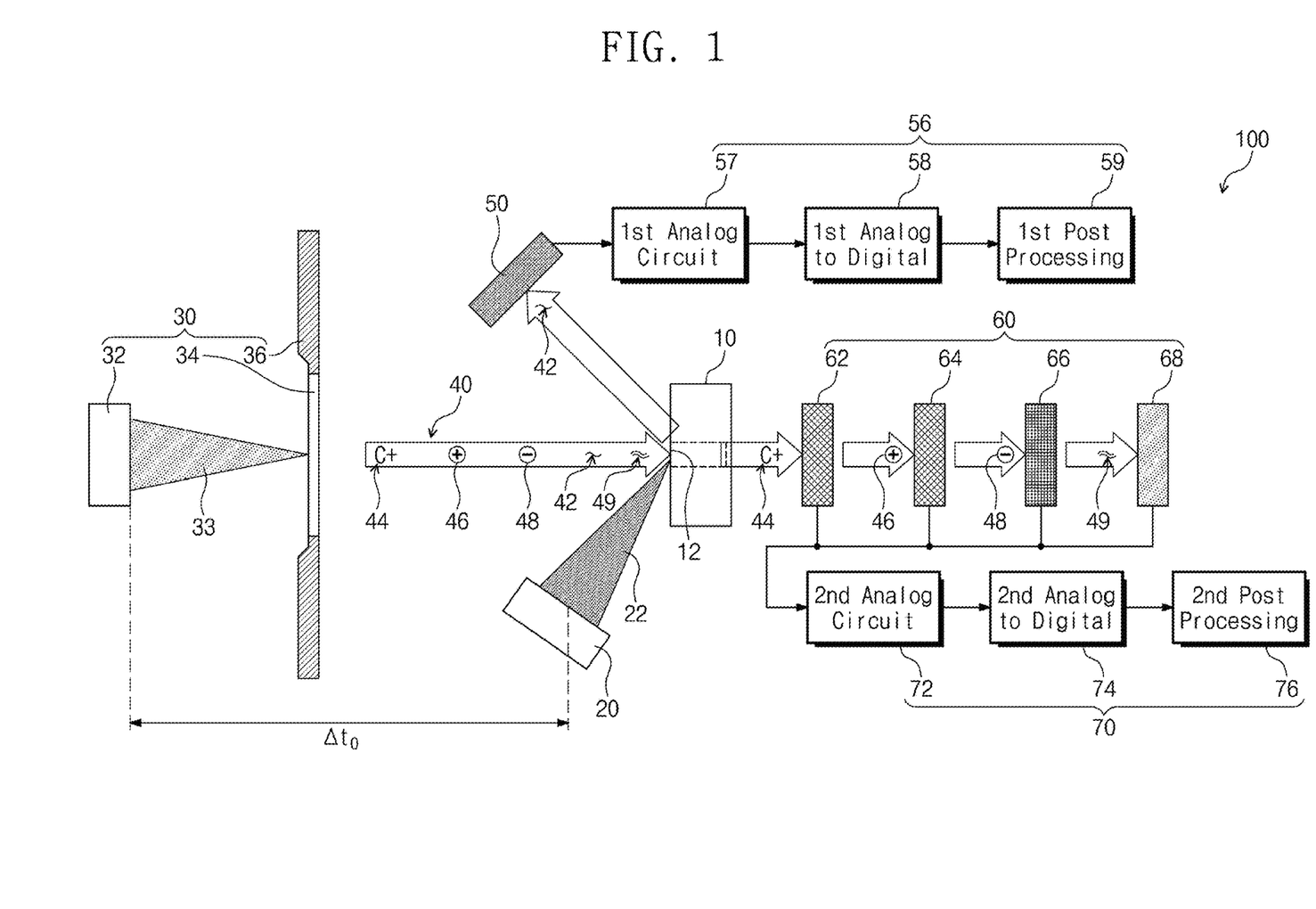
FIG. 1 is a view illustrating one example of a sample analyzer according to an embodiment of the inventive concept.

FIG. 1 a view illustrating one example of a sample analyzer 100 according to an embodiment of the inventive concept.

Referring to FIG. 1, the sample analyzer 100 according to an embodiment of the inventive concept may be a multi-time-resolved analyzer. For example, the sample analyzer 100 may include a sample 10, a first beam source 20, a second beam source 30, a reflected beam sensor 50, and transmitted beam sensors 60.

The sample 10 may be disposed between the first beam source 20 and the transmitted beam sensors 60 and between the second beam source 30 and the transmitted beam sensors 60. For example, the sample 10 may include amorphous silicon. The sample 10 may be fixed to a sample holder (not shown).

The first beam source 20 may be disposed adjacent to one side of the sample 10. The first beam source 20 may provide a first energy beam 22 to an exposed surface 12 of one side of the sample 10. The first energy beam 22 may include a laser beam in an ultraviolet (UV) region. The sample 10 may absorb the first energy beam 22. A portion of the sample 10, which is exposed to the first energy beam 22, may be melted and then solidified by the first energy beam 22. As a result, a phase and/or state of the sample 10 may be changed. For example, the amorphous silicon sample 10 may absorb the first energy beam 22 and be melted into a liquid. The melted sample 10 may be changed to polycrystalline silicon or crystalline silicon according to a cooling temperature. The sample 10 may have a phase change time of about 10 nsec.

The second beam source 30 may be disposed adjacent to one side of the sample 10 or the first beam source 20. The second beam source 30 may generate a second energy beam 40. The second energy beam 40 may have an intensity greater than that of the first energy beam 22. For example, the second beam source 30 may be a multi-energy beam generator. For example, the second beam source 30 may include a light source 32, a target 34, and a target holder 36. The light source 32 may include a Ti-Sapphire laser device or a Nd:YAG pulse laser device. The light source 32 may provide a laser beam 33 to the target 34. The laser beam 33 may have a power greater than that of the first energy beam 22. For example, the laser beam 33 may have a power of about $1 \times 10^{18}$ W/cm$^2$ to about $1 \times 10^{21}$ W/cm$^2$. The target 34 may be disposed between the light source 32 and the sample 10. The target 34 may be a thin-film containing a hydrogen or carbon component. For example, the target 34 may include graphene. The target 34 may have a thickness of about 50 nm to about 10 μm. The target holder 36 may fix the target 34 between the light source 32 and the sample 10.

When the laser beam 33 is provided to the target 34, the target 34 may release and/or accelerate the second energy beam 40. The second energy beam 40 may be accelerated based on a theory such as a target normal sheath acceleration (TNSA) modeling or a radiation pressure acceleration (RPA) modeling. The second energy beam 40 may be provided to the sample 10. For example, the second energy beam 40 may be provided to the exposed surface 13 of the first energy beam 22. The second energy beam 40 may be absorbed into, reflected by, and transmitted through the sample 10. The second energy beam 40 may be different from the first energy beam 22. The second energy beam 40 may be a multi-energy beam. For example, the second energy beam 40 may include an ultraviolet beam 42, an ion particle beam 44, a proton beam 46, an electron beam 48, and a radiation beam 49. The ion particle beam 44 may include carbon ion particles or hydrogen ion particles. The radiation beam 49 may include an X-ray, an α-ray, a β-ray, and a γ-ray.

Figure 2:
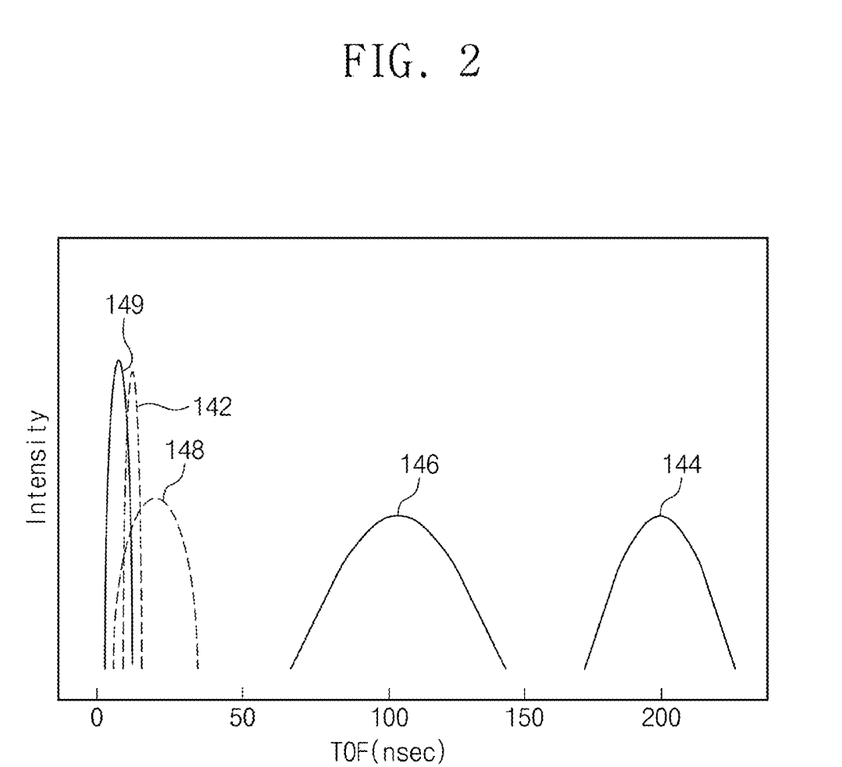
FIG. 2 is a graph representing a time of flight of a second energy beam in FIG. 1.

FIG. 2 shows a time of flight of the second energy beam 40 in FIG. 1.

Referring to FIG. 2, the ultraviolet beam 42, the ion particle beam 44, the proton beam 46, the electron beam 48, and the radiation beam 49 of the second energy beam 40 may have different times of flight from each other. For example, the ultraviolet beam 42 may have a first time of flight 142 of about 15 nsec. The ion particle beam 44 may have a second time of flight 144 of about 200 nsec. The proton beam 46 may have a third time of flight 145 of about 100 nsec. The electron beam 48 may have a fourth time of flight 148 of about 25 nsec. The radiation beam 49 may have a fifth time of flight 149 of 10 nsec.

Here, the second energy beam 40 may be provided during a phase change process of the sample 10 caused by the first energy beam 22. For example, the second energy beam 40 may be simultaneously provided with the first energy beam 22 to the exposed surface 12 of one side of the sample 10. When the first energy beam 22 and the second energy beam 40 are provided at the same time, the laser beam 33 may be provided to the target 34 prior to the first energy beam 22. The laser beam 33 may have a time of flight equal to or greater than that of the second energy beam 40 and be provided prior to the first energy beam 22. That is, the laser beam 33 and the first energy beam 22 may be sequentially provided with a time difference (Δt). For example, the laser beam 33 may be provided prior to the first energy beam 22 with a time of flight equal to or greater than the fifth time of flight 149 of the radiation beam 49. For example, the time difference (Δt) between the laser beam 33 and the first energy beam 22 may be about 10 nsec or more. The laser beam 33 may be provided to the target 34 about 10 nsec prior to the first energy beam 22.

When the second energy beam 40 is provided to the sample 10, the ultraviolet beam 42 may be absorbed into or reflected by the sample 10. The ion particle beam 44, the proton beam 46, the electron beam 48, and the radiation beam 49 may be transmitted through the sample 10.

The reflected beam sensor 50 may be disposed between the target 34 and the sample 10. For example, the reflected beam sensor 50 may include a CMOS image sensor. The reflected beam sensor 50 may detect a reflected beam of the second energy beam 40, which is reflected at the exposed surface 12 of the sample 10, i.e., the ultraviolet beam 42. Thus, the reflected beam sensor 50 may detect the ultraviolet beam 42 of the second energy beam 40 and real-time measure the phase change process of the sample 10. A first image processing device 56 may be connected to the reflected beam sensor 50. The first image processing device 56 may process a detected signal of the ultraviolet beam 42 and acquire an image of the ultraviolet beam 42. The first image processing device 56 may include a first analog circuit 57, a first A/D converter 58, and a first post-image processing circuit 59. The first analog circuit 57 may convert and amplify the detected signal into an analog signal. The first A/D converter 58 may convert the analog signal into a digital signal. The first post-image processing circuit 59 may convert the digital signal into an image signal. Also, the first image processing device 56 may calculate a reflectance of the sample 10 with respect to the ultraviolet beam 42.

Figure 3A:
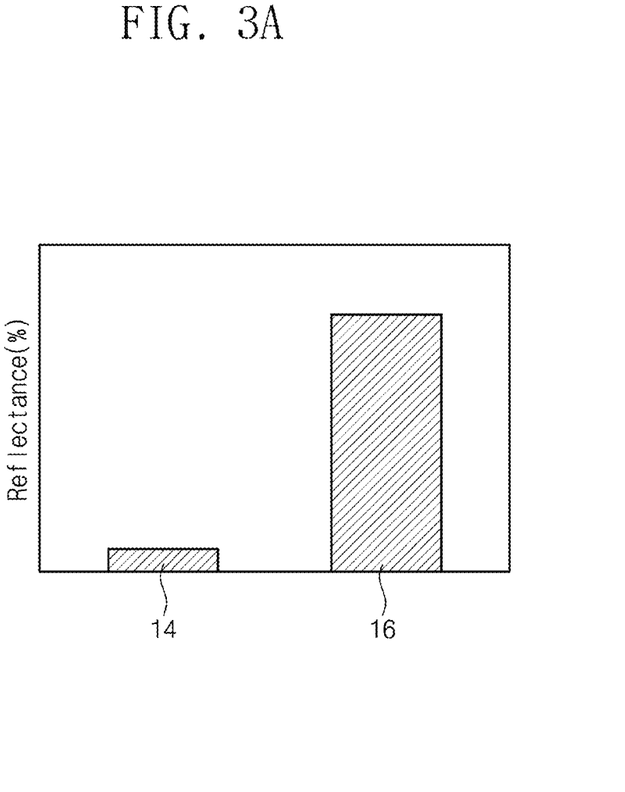
FIG. 3A is a graph representing a reflectance of a sample in FIG. 1.

FIG. 3A shows a first reflectance 14 and a second reflectance 16 of the sample 10 in FIG. 1.

Referring to FIG. 3A, the sample 10 may have a reflectance that is varied according to the phase change thereof. For example, the sample 10 may have the first reflectance 14 before the phase change thereof and the second reflectance 16 after the phase change thereof. The second reflectance 16 may be greater than the first reflectance 14. When the amorphous silicon sample 10 is changed into a polycrystalline silicon, the first reflectance 14 of the amorphous silicon may be less than the second reflectance 16 of the polycrystalline silicon. The amorphous silicon may absorb most of the ultraviolet beam 42. Since a density and/or flatness of the polycrystalline silicon is greater than a density and/or flatness of the amorphous silicon, the polycrystalline silicon may reflect the ultraviolet beam 42 more than the amorphous silicon.

Referring to FIG. 1 again, the transmitted beam sensors 60 may be disposed adjacent to the other side of the sample 10. The transmitted beam sensors 60 may detect the beams transmitted through the sample 10, i.e., the ion particle beam 44, the proton beam 46, the electron beam 48, and the radiation beam 49. The transmitted beam sensors 60 may detect the ion particle beam 44, the proton beam 46, the electron beam 48, and the radiation beam 49 and real-time measure the phase change process of the sample 10.

A second image processing device 70 may be connected to the transmitted beam sensors 60. The second image processing device 70 may process a detected signal of the ion particle beam 44, the proton beam 46, the electron beam 48, and the radiation beam 49 and acquire a plurality of images. The second image processing device 70 may include a second analog circuit 72, a second A/D converter 74, and a second post-image processing circuit 76. The second analog circuit 72 may convert and amplify the detected signal into an analog signal. The second A/D converter 74 may convert the analog signal into a digital signal. The second post-image processing circuit 67 may convert the digital signal into an image signal. Also, the second image processing device 70 may calculate a reflectance of the sample 10 with respect to the second energy beam 40. For example, the transmitted beam sensors 60 may include an ion sensor 62, a proton sensor 64, an electron sensor 66, and a radiation sensor 68.

The ion sensor 62 may be disposed adjacent to the other side of the sample 10. For example, the ion sensor 62 may include a gold nano-particle sensor. The ion sensor 62 may detect the ion particle beam 44. The second image processing device 70 may acquire an image or a transmittance of the ion particle beam 44 by using a detected signal of the ion sensor 62. The proton beam 46, the electron beam 48, and the radiation beam 49 may pass through the ion sensor 62.

The proton sensor 64 may be disposed between the ion sensor 62 and the electron sensor 66. For example, the proton sensor 64 may include a silicon sensor of a proton detector. The proton sensor 64 may detect the proton beam 46. The second image processing device 70 may acquire an image or a transmittance of the proton beam 46 by using a detected signal of the proton sensor 64. The electron beam 48 and the radiation beam 49 may pass through the proton sensor 64.

Figure 3B:
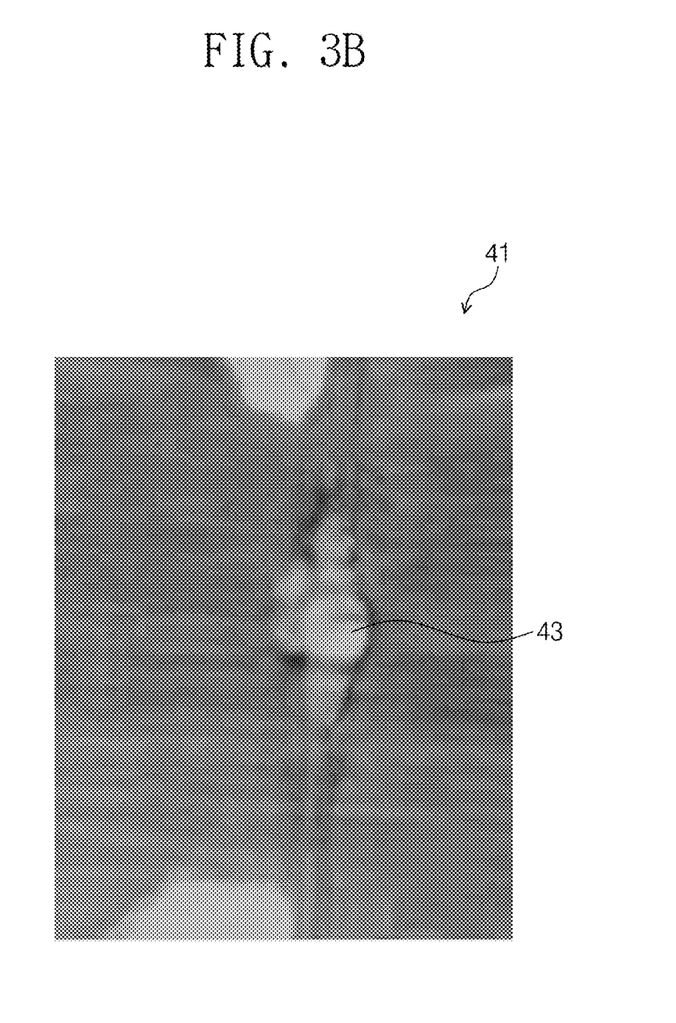
FIG. 3B is a photograph showing an image of a proton beam in FIG. 1.

FIG. 3B shows an image 41 of the proton beam 46 in FIG. 1.

Referring to FIG. 3B, the image 41 of the proton beam 46 may have a bubble image 43. The bubble image 43 may correspond to a phase changed portion (e.g., polycrystalline silicon) of the sample 10 of the amorphous silicon.

Referring to FIG. 1 again, the electron sensor 66 may be disposed between the proton sensor 64 and the radiation sensor 68. For example, the electron sensor 66 may include a scanning electron microscopy (SEM) and an electron capture detector (ECD). The electron sensor 66 may detect the electron beam 48. The second image processing device 70 may acquire an image or a transmittance of the electron beam 48 by using a detected signal of the electron sensor 66. The radiation beam 49 may pass through the electron sensor 66.

Figure 3C:
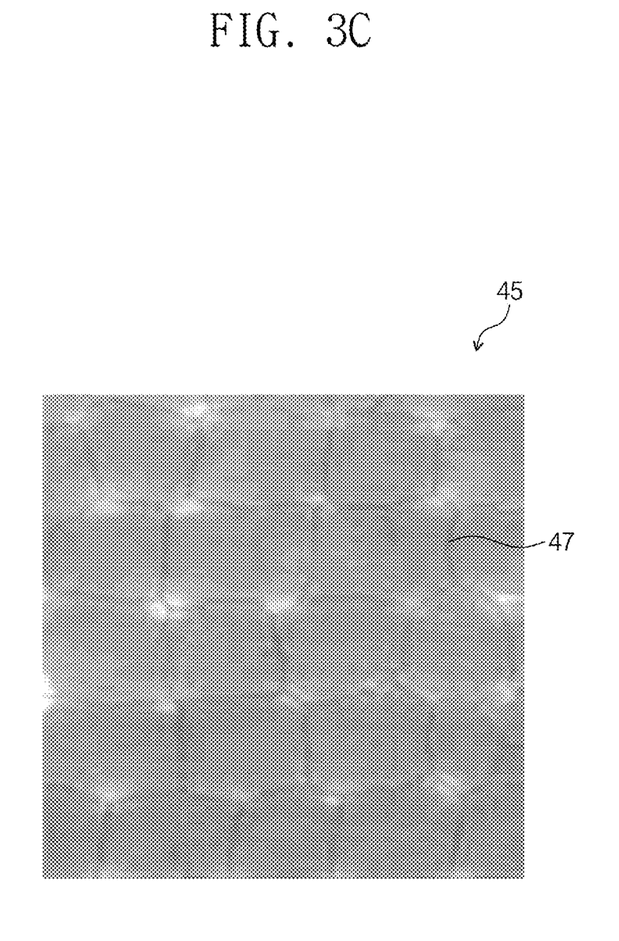
FIG. 3C is a photograph showing an image of an electron beam in FIG. 1.

FIG. 3C shows an image 45 of the electron beam 48 in FIG. 1.

Referring to FIG. 3C, an image 45 of the electron beam 48 may have a boundary image 47. When the amorphous silicon sample 10 is changed into a crystalline silicon, the boundary image 47 may correspond to grain boundaries of the crystalline silicon.

Referring to FIG. 1 again, the radiation sensor 68 may be disposed behind the electron sensor 66. For example, the radiation sensor 68 may include a X-ray detector, an α-ray detector, a β-ray detector, and a γ-ray detector. The second sensor 49 may detect the radiation beam 49. The second image processing device 70 may acquire an intensity or a transmittance of the radiation beam 49 by using a detected signal of the radiation sensor 68.

Figure 3D:
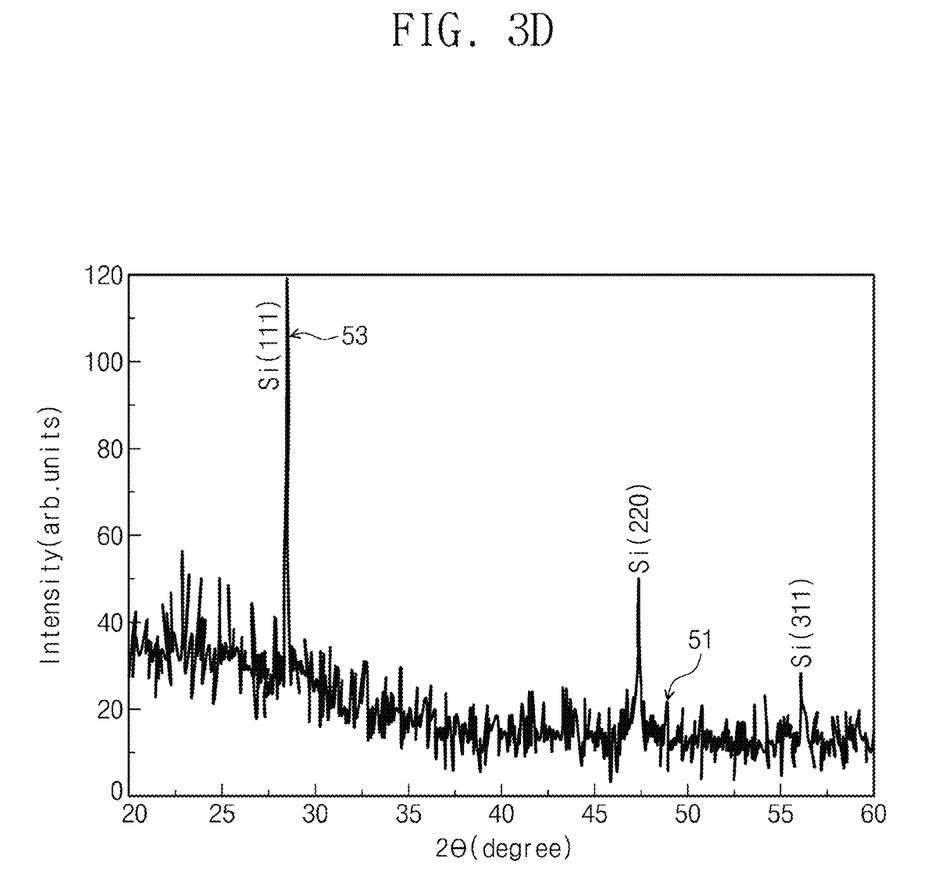
FIG. 3D is a graph representing an intensity distribution of a radiation beam in FIG. 1.

Referring to FIG. 3D, an intensity distribution 51 of the radiation beam 49 may be varied according to a diffraction angle 20. The diffraction angle 20 may be a tilted angle with respect to an incident direction or a transmission direction of the radiation beam 49. Peaks 53 of the intensity distribution 51 may correspond to crystalline surfaces (e.g., Si(111), Si(220), and Si(311)) of the sample 10.

Hereinafter, a method for analyzing a sample according to an embodiment of the inventive concept will be described.

Figure 4:
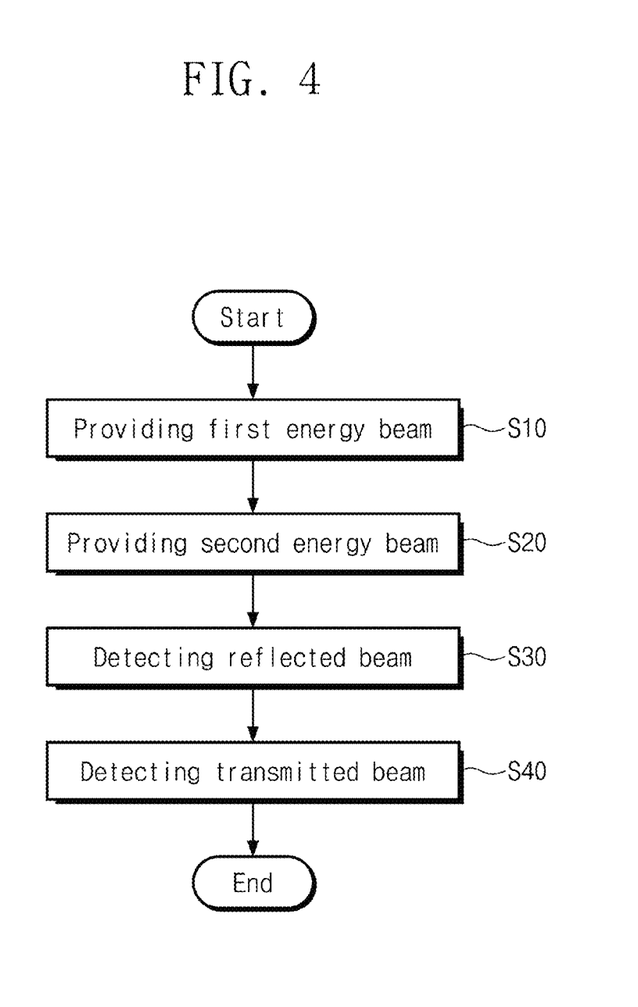
FIG. 4 is a flowchart representing a method for analyzing a sample according to an embodiment of the inventive concept.

FIG. 4 shows a method for analyzing a sample according to an embodiment of the inventive concept.

Referring to FIG. 4, a method for analyzing a sample according to an embodiment of the inventive concept may include: a process S10 of providing the first energy beam 22, a process S20 of providing the second energy beam 40, a process S30 of detecting a reflected beam, and a process of detecting a transmitted beam.

First, the first beam source 20 provides the first energy beam 22 to the sample 10 in the process S10. The sample 10 may be melted and then solidified by absorbing the first energy beam 22. The first energy beam 22 may change a phase of the sample 10.

Thereafter, the second beam source 30 provides the second energy beam 40 to the sample in the process S20. The second energy beam 40 may provided in the substantially same manner as the first energy beam 22. For example, the process S20 of providing the second energy beam 40 may include a process of providing the laser beam 33 to the target 34. The laser beam 33 may be provided to the target 34 prior to the first energy beam 22 with a time difference (Δt) from the first energy beam 22.

Thereafter, the reflected beam sensor 50 detects a reflected beam in the process S30. The reflected beam sensor 50 may detect the ultraviolet beam 42. The first image processing device 56 may acquire an image of the sample 10 by using a detected signal of the ultraviolet beam 42 or a reflectance of the ultraviolet beam 42.

Also, the transmitted beam sensors 60 detect a transmitted beam in the process S40.

Figure 5:
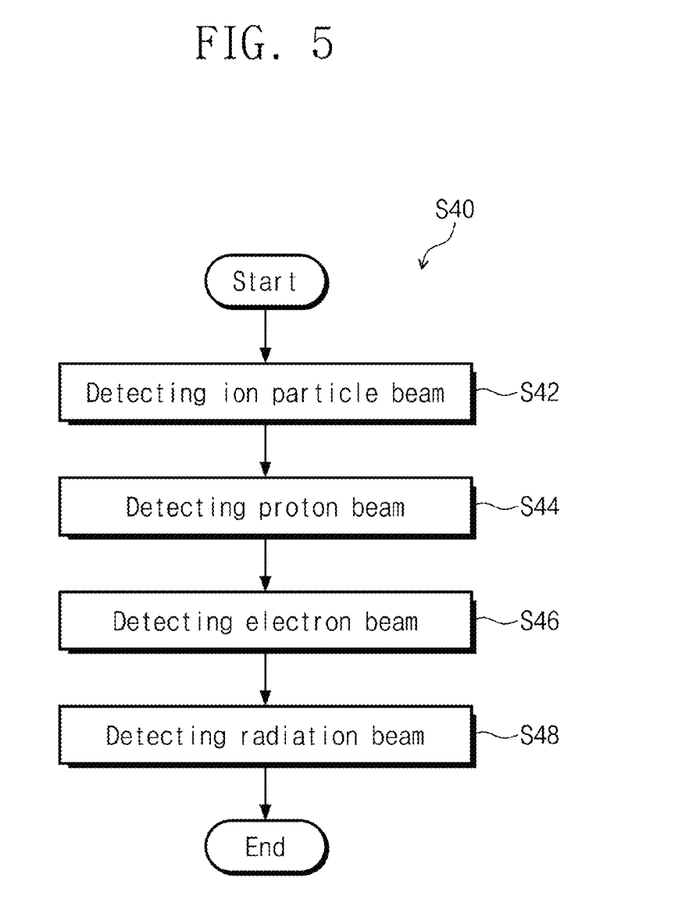
FIG. 5 is a flowchart representing one example of a process of detecting a transmitted beam by transmitted beam sensors in FIG. 1.

FIG. 5 shows one example of the process S40 of detecting a transmitted beam of the transmitted beam sensors 60 in FIG. 1.

Referring to FIG. 5, the process S40 of detecting a transmitted beam of the transmitted beam sensors 60 may include: a process S42 of detecting the ion particle beam 44, a process S44 of detecting the proton beam 46, a process S46 of detecting the electron beam 48, and a process S48 of detecting the radiation beam 49.

The ion sensor 62 detects the ion particle beam 44 in the process S42. The second image processing device 70 may acquire an image or a transmittance of the ion particle beam 44 by using a detected signal of the ion sensor 62.

The proton sensor 64 detects the proton beam 46 in the process S44. The second image processing device 70 may acquire an image or a transmittance of the proton beam 46 by using a detected signal of the proton sensor 64.

The electron sensor 66 detects the electron beam 48 in the process S46. The second image processing device 70 may acquire an image or a transmittance of the electron beam 48 by using a detected signal of the electron sensor 66. The radiation beam 49 may pass through the electron sensor 66.

The radiation sensor 68 detects the radiation beam 49 in the process S48. The second image processing device 70 may acquire an intensity distribution or a transmittance of the radiation beam 49 by using a detected signal of the radiation sensor 68.

As described above, the sample analyzer according to the embodiment of the inventive concept may real-time measure the phase change process of the sample by detecting energy beams reflected by or transmitted through the sample.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A sample analyzer comprising:
   a first beam source configured to provide a first energy beam to a sample;
   a second beam source configured to provide a second energy beam, which is different from the first energy beam, to the sample;
   a reflected beam sensor disposed between the second beam source and the sample to detect a reflected beam of the second energy beam, which is reflected by one side of the sample; and
   a transmitted beam sensor disposed adjacent to the other side of the sample to detect a transmitted beam of the second energy beam,
   wherein the transmitted beam sensor comprises a radiation sensor, an electron sensor disposed between the sample and the radiation sensor, and a proton sensor disposed between the sample and the electron sensor.

2. The sample analyzer of claim 1, wherein the second beam source is a multi-energy beam generator.

3. The sample analyzer of claim 2, wherein the second energy beam is a multi-energy beam comprising an ultraviolet ray, an ion particle, a proton, an electron, and a radiation.

4. The sample analyzer of claim 1, wherein the transmitted beam sensor further comprises an ion sensor disposed between the sample and the proton sensor.

* * * * *